United States Patent [19]
Wilson et al.

[11] Patent Number: 5,497,152
[45] Date of Patent: Mar. 5, 1996

[54] DIGITAL-TO-DIGITAL CONVERSION USING NON-UNIFORM SAMPLE RATES

[75] Inventors: James Wilson, Sharon; Ronald A. Cellini, Newton; James M. Sobol, Norfolk, all of Mass.

[73] Assignee: Analog Devices, Inc., Norwood, Mass.

[21] Appl. No.: 241,059

[22] Filed: May 11, 1994

Related U.S. Application Data

[63] Continuation-in-part of Ser. No. 120,957, Sep. 13, 1993, abandoned, and Ser. No. 121,104, Sep. 13, 1993.

[51] Int. Cl.⁶ .................................................. H03M 7/00
[52] U.S. Cl. ........................ 341/61; 341/143; 364/724.1
[58] Field of Search ..................... 341/61, 143; 331/1 R; 364/724.1

[56] References Cited

U.S. PATENT DOCUMENTS

| | | | |
|---|---|---|---|
| 5,157,395 | 10/1992 | Del Signore et al. | 341/143 |
| 5,331,346 | 7/1994 | Shields et al. | 341/61 |
| 5,349,352 | 9/1994 | Saleh | 341/143 |
| 5,357,248 | 10/1994 | Sasaki | 341/61 |
| 5,389,923 | 2/1995 | Iwata et al. | 341/61 |

Primary Examiner—A. D. Pellinen
Assistant Examiner—Jason Kost
Attorney, Agent, or Firm—Wolf, Greenfield & Sacks

[57] ABSTRACT

A method and apparatus for digital-to-digital conversion using sigma-delta modulation of the temporal spacing between digital samples. The method and apparatus of the present invention provides for sigma-delta modulation of the time base such that noise produced by non-uniform sampling are frequency-shaped to a region (i.e., shifted to higher frequencies) where it can be removed by conventional filtering techniques. In one embodiment, the digital data is interpolated by fixed ratio and then decimated under control of a sigma-delta modulated frequency selection signal that represents, on average, the data rate of the incoming digital data stream. Thereafter, the digital data is interpolated under control of a sigma-delta modulated frequency selection signal that represents, on average, the data rate of the digital data to be output by the converter and then decimated by a fixed ratio. The first and second frequency signal selection numbers are modulated using n-th order m-bit sigma-delta modulators. The method and apparatus converts the data rate of the incoming digital data stream to the data rate of the first n-th m-bit sigma-delta modulator and then converts the digital data stream from the first sigma-delta modulator to an output data rate determined by the second n-th order m-bit sigma-delta modulator.

4 Claims, 8 Drawing Sheets

DIGITAL-TO-DIGITAL CONVERSION USING NON-UNIFORM SAMPLE RATES

CROSS-REFERENCE TO RELATED APPLICATIONS

This application is a continuation-in-part of our application Ser. No. 08/120,957, filed Sep. 13, 1993, now abandoned, entitled DIGITAL TO ANALOG CONVERSION USING NON-UNIFORM SAMPLE RATES and application Ser. No. 08/121,104, filed Sep. 13, 1993, entitled ANALOG TO DIGITAL CONVERSION USING NON-UNIFORM SAMPLE RATES, the disclosures of which are incorporated herein by reference in their entirety.

BACKGROUND OF THE INVENTION

1. Field of the Invention

The present invention relates generally to the field of methods and circuits for digital-to-digital conversion. More particularly, the present invention relates to a method and circuit for digital-to-digital signal conversion using sigma-delta modulation of the temporal spacing between digital samples.

2. Discussion of the Related Art

Digital-to-digital converter circuits and methods for digital-to-digital conversion are well-known in the art. One example of a conventional digital-to-digital converter is the AD1890/AD1891 asynchronous sample rate converter, manufactured by Analog Devices, Incorporated, One Technology Way, P.O. Box 9106, Norwood, Mass., 02062. Conceptually, these converters interpolate the input data up to a very high equivalent internal sample rate with a time resolution of 300 picoseconds and then decimate the interpolated data down to the desired output sample rate. The equivalent frequency of the oversampled digital data is approximately 3.2768 gigahertz. FIG. 1 is an overall functional block diagram of the AD 1890/1891. As shown in FIG. 1, the input digital data at a data rate Fs1 is interpolated at some ratio by inserting zero valued samples between each of the original input signal samples by the interpolator. The oversampled signal is then fed into a digital FIR low-pass filter to smooth or integrate the sequence. The interpolated and filtered digital data is then passed to a zero-order hold register and then asynchronously resampled by decimating the digital data stream in the decimation block to produce the digital data out at a data rate Fs2.

One of the limitations of conventional digital-to-digital converters is that they only determine the magnitude of the input signal at equally spaced temporal intervals. This is known as uniform sampling. Additionally, in conventional digital-to-digital converters, the sample rate, that is, the rate of the incoming digital data stream cannot be independent of the master clock that is used to clock the digital-to-digital converter. The incoming digital data rate must be some integer division of the master clock of the digital-to-digital converter chip. This means that if the digital-to-digital converter were to receive digital data at two different data rates, that are not necessarily divisible into the master clock (or more generally, digital data at a rate that is not integrally divisible into the master clock), there must be two different frequency master clocks available for clocking the digital-to-digital converter (or more generally, there must be a master clock that has an integer relationship with the data rate of the incoming digital data available to clock the digital-to-digital converter.

Another problem with conventional digital-to-digital converters is that they are typically not designed to be clocked by an externally supplied clock signal. The components of the digital-to-digital converter are typically optimized to operate at the clock frequency determined by the master clock on the digital-to-digital converter chip. This leads to the additional limitation that some digital-to-digital converters cannot lock to and operate at some externally supplied clock signal. Therefore, if there are any changes in the digital data rate, since the incoming digital data stream and the master clock for the digital-to-digital converter are not necessarily related to each other, any temporal changes in the relative frequencies of the incoming digital data rate and the master clock can disrupt the entire digital-to-digital conversion process.

In addition, the number of FIR filter taps and associated coefficients can become so large as to make the filter complicated and difficult to obtain a high throughput when the incoming digital data stream has a fast data rate.

Therefore, an object of the present invention is to provide a method and apparatus for performing digital-to-digital conversion using non-uniform sampling (i.e., variable temporal spacing of the sampling points).

Another object of the present invention is to provide a method and apparatus for performing digital-to-digital conversion that can lock to an externally supplied clock signal and can provide a sampling rate that is independent of the converter's master clock.

SUMMARY OF THE INVENTION

The present invention overcomes the limitations of the prior art by providing a method and apparatus for digital-to-digital conversion using non-uniform sampling. In one embodiment of the invention, the apparatus includes a first interpolator or other comparable circuitry such as a sample and hold circuit for receiving digital signals at a first data rate and for supplying the digital signals at a first increased data rate and a first decimator, coupled to the first interpolator, for decimating the digital signals at the first increased data rate to provide digital signals at a second data rate. In one embodiment, a first sigma-delta modulator is coupled to and controls the first decimator and provides a first sigma-delta modulated output signal representative of the first data rate and controls the first decimator to provide the digital signals at the second data rate. This part of the invention interpolates digital data by a fixed ratio and then decimates the interpolated digital data by a variable ratio depending on the second data rate desired. Depending on the performance requirements of the particular application, the decimated digital data at the second data rate may then be filtered to remove, for example, sigma-delta noise introduced by the variable decimation of the digital data at the first increased data rate.

The digital data at the second data rate is supplied to a second interpolator or other comparable circuitry such as a sample and hold circuit that receives the digital data at the second data rate and supplies the digital signals at a second increased data rate. A second decimator is coupled to the interpolator and decimates the digital signals at the second increased data rate to provide digital signals at a third data rate. In one embodiment, a second sigma-delta modulator is coupled to and controls the second interpolator and provides a second sigma-delta modulated output signal representative of the third data rate to control the second interpolator to provide the digital signals at the second increased data rate so that, upon decimation by the second decimator, the digital signals are at the third data rate. This part of the invention interpolates the digital data by a variable ratio depending on the third data rate desired and then decimates the interpolated digital data by a fixed ratio.

In another embodiment of the invention, a first phase locked loop (PLL) which may be a digital PLL or may be an analog PLL having its output coupled to the first sigma-delta modulator is provided for receiving a signal representative of the first data rate, locking to the signal, and providing a first control signal to the first sigma-delta modulator that controls the first sigma-delta modulator to provide the sigma-delta modulated output signal. In one embodiment, the first sigma-delta modulator forms part of the digitally controlled oscillator in the PLL. The first phase locked loop allows the circuit to lock to and track any externally-supplied clock signal.

In another embodiment of the invention, a second phase locked loop (PLL) which may be a digital PLL or may be an analog PLL having its output coupled to the second sigma-delta modulator is provided for receiving a signal representative of the third data rate, locking to the signal, and providing a second control signal to the second sigma-delta modulator that controls the second sigma-delta modulator to provide the second sigma-delta modulated output signal. The second sigma-delta modulator forms part of the digitally controlled oscillator in the PLL. The second phase locked loop allows the circuit to lock to and track any externally-supplied clock signal.

Broadly stated, the method of the present invention includes sigma-delta modulation of the time base such that errors produced by non-uniform sampling are frequency-shaped to a region (i.e., shifted to higher frequencies) where they can be removed by conventional filtering techniques.

In one part of the invention, the method is to perform a fixed interpolation (or other method of increasing the data rate or sample rate of the digital signal or digital data stream) and filtering to remove images followed by variable decimation with the decimation controlled by a first sigma-delta modulator that is fed a frequency selection signal representing the sampling frequency or data rate of the input data stream. Fixed interpolation means that the interpolation ratio is the same regardless of the sample rate. Variable decimation means that the decimation ratio is varied as a function of the desired output sample rate. More particularly, a digital data stream at a data rate within some predetermined limits is interpolated to a higher data rate. This higher data rate digital data stream is then decimated using a control signal that is a sigma-delta modulated signal that represents the data rate of the incoming digital data stream. The frequency selection signal is modulated using a first n-th order m-bit sigma-delta modulator. This control signal (the sigma-delta modulated frequency selection number output by the second sigma-delta modulator) represents, on average, the data rate of the incoming digital data stream. Data thus emerges from the interpolation/decimation process at the clock rate of the n-th order m-bit sigma-delta modulator.

This part of the method thus converts the data rate of the incoming digital data stream to the data rate of the n-th order m-bit sigma-delta modulator.

Once the data rate of the incoming digital data stream has been converted to the data rate of the first n-th order m-bit sigma-delta modulator, another part of the method is to perform a variable interpolation (or other method to increase the data rate or sampling frequency of the digital signal or digital data stream) and filtering to remove images followed by a fixed decimation with the interpolation controlled by a second sigma-delta modulator that is fed a frequency selection signal representing the desired output sample rate. Variable interpolation means that the interpolation ratio is varied as a function of the desired output sample rate. Fixed decimation means that the decimation ratio is the same regardless of the sample rate. More particularly, the digital data stream at the data rate of the first n-th order m-bit sigma-delta modulator is interpolated to a higher data rate using a control signal that is a sigma-delta modulated signal that represents the desired output data rate (i.e., sample rate or sampling frequency). The frequency selection signal is modulated using a second n-th order m-bit sigma-delta modulator. This control signal (the sigma-delta modulated frequency selection signal output by the second sigma-delta modulator) represents, on average, the sample rate of the digital data to be output by the converter. The control signal controls the interpolator to increase the data rate such that, upon fixed decimation, data emerges from the interpolation/decimation process at the desired output sample rate.

This part of the method thus converts the data rate of the digital data stream output by the variable decimation process from an oversampled signal to a digital data stream having the desired sample rate.

The features and advantages of the present invention will be more readily understood and apparent from the following detailed description of the invention, which should be read in conjunction with the accompanying drawings, and from the claims which are appended at the end of the detailed description.

BRIEF DESCRIPTION OF THE DRAWINGS

In the drawings, which are incorporated herein by reference and in which like elements have been given like reference characters.

DETAILED DESCRIPTION

For purposes of illustration only, and not to limit generality, the present invention will now be explained with reference to specific data rates, interpolation (or more generally sample rate increase) ratios, decimation ratios, and clock frequencies of operation. One skilled in the art will recognize that the present invention is not limited to the specific embodiment disclosed, and can be more generally applied to other circuits and methods having different operating parameters than those illustrated.

Figure 2:
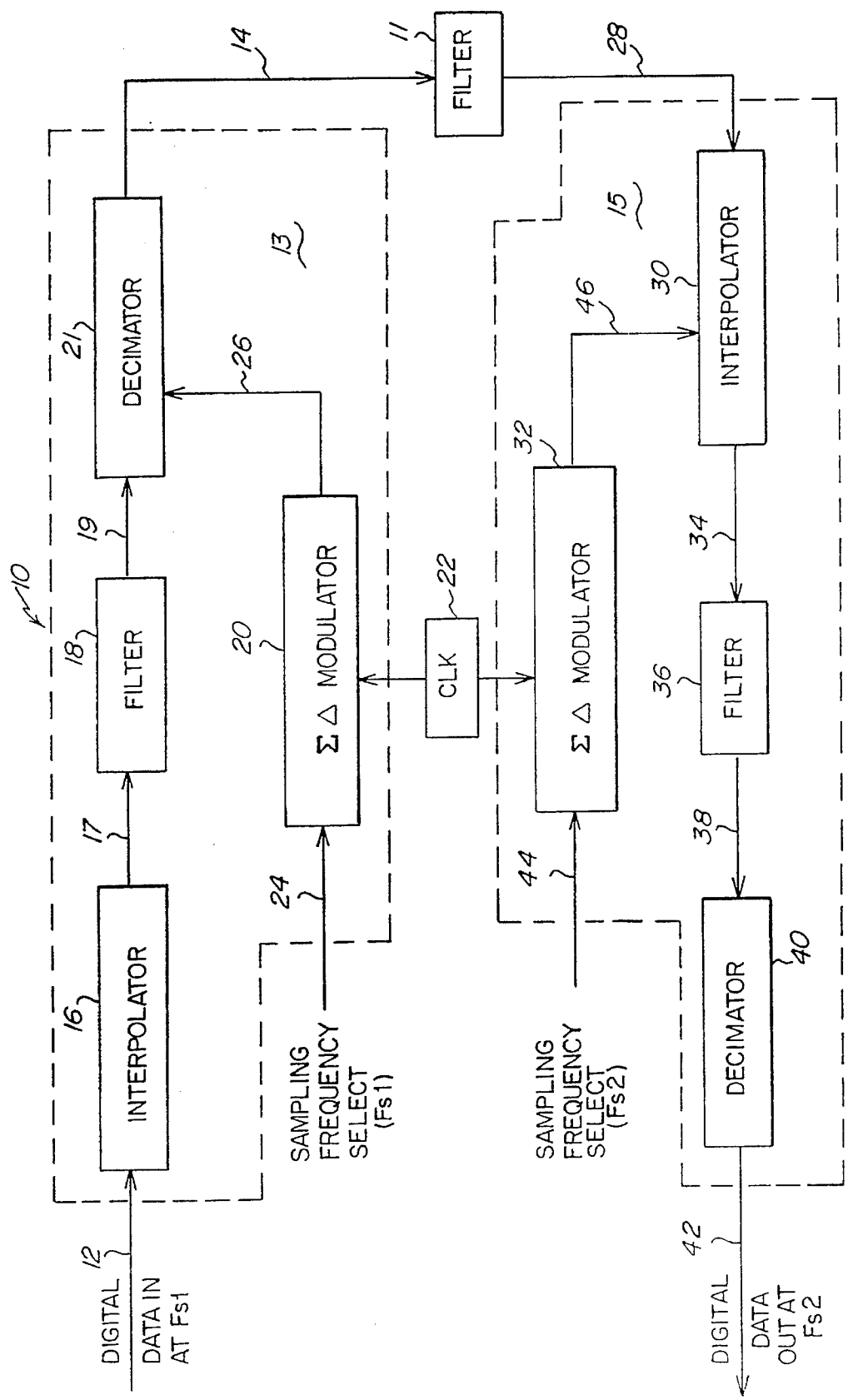
FIG. 2 is a block diagram of a digital-to-digital converter circuit incorporating one embodiment of the invention.

FIG. 2 is a block diagram broadly illustrating one embodiment of the invention. The overall purpose of circuit 10 is to receive a digital data stream on line 12 at any data rate within a predetermined working range of the system and to convert the digital data to a digital data stream on line 42. The data rate of the digital data stream on line 42 can be the same as, higher, or lower than the data rate of the digital data stream on line 12.

Circuit 10 performs this function by increasing the sample rate (Fs1) of the digital data stream on line 12 to create a first so-called "oversampled" signal and then decimates this higher rate data stream so that the data stream presented on line 14 is at a fixed, predetermined data rate. In other words, circuit part 13 of circuit 10 receives digital data at any data rate within the predetermined working range of the system, and converts this data to a digital data stream on line 14 at another data rate. The data rate on line 14 may or may not be the same as the data rate of the input data stream and may be a fixed or a variable rate. The digital data stream on line 12 may be of any width (i.e., any number of bits). Once the digital data on line 12 has been converted to the predetermined data rate on line 14, circuit 10 increases the sample rate of the digital data on line 14 to create a second so-called "oversampled" signal and then decimates this higher rate digital data stream so that the data presented on line 42 is at a desired output sampling rate. In other words, circuit part 15 of circuit 10 receives digital data at the fixed, predetermined data rate and converts this data to a digital data stream at another data rate.

In circuit part 13 of the circuit 10 illustrated in FIG. 2, an interpolator 16 receives the digital data stream on line 12 at any data rate (Fs1) within the predetermined working range. Interpolator 16 increases the sample rate of the digital data stream (that is, converts the digital data stream into a higher sample rate digital data stream) on line 12 by, for example, inserting zeros between data samples, in a manner well-known to those skilled in the art. One skilled in the art will appreciate that other techniques may be used for increasing the sample rate of the data stream on line 12, such as sample and hold techniques. The purpose of interpolator 16 is to increase the sample rate of the digital data stream on line 12 to create an oversampled signal. A higher sample rate digital data stream 17 is then sent to a digital filter 18 which attenuates any images of the original digital signal as a result of the interpolation process. The filtered digital data stream on line 19 is then sent to a decimation block 21 that decimates digital data stream on line 19 under control of the sigma-delta modulator 20. Although filter 18 and decimation block 21 have been illustrated as separate circuit elements for illustrative purposes, one skilled in the art will appreciate that these functions may be performed by a single computational element, such as an FIR or IIR filter in a well-known manner.

The sigma-delta modulator 20 produces digital data at the frequency of clock 22, the data controlling the decimation of decimation block 21. As will be explained in more detail hereinafter, the sigma-delta modulator 20 sigma-delta modulates a signal 24 representative of the data rate (Fs1) of the digital data stream on line 12. An example will serve to illustrate this function. Assume that the data rate of the data stream on line 12 is 48 kHz. Interpolator 16 increases this data rate to 18.432 MHz by interpolating the data by a factor of 384. Assume the frequency of clock 22 is 3.072 MHz. Since the data rate of data stream 12 is 48 kHz, signal 24 is therefore a multi-bit digital number representative of a sampling rate of 48 kHz where the number of bits in the digital number control the precision with which the data rate of digital data stream on line 12 can be specified. This digital number is sigma-delta modulated by the sigma-delta modulator 20 and used to control decimation block 21 to produce one output signal for every six samples in digital data stream 19. The 18.432 MHz data is then effectively decimated by a factor of six and the digital data stream on line 14 is therefore at, on average, a 3.072 MHz data rate.

Sigma delta modulator 20 is preferably an n-th order m-bit sigma-delta modulator. The higher the order of the sigma-delta modulator, the better the noise shaped characteristics of the output signal on line 26. The signal on line 26 output by sigma-delta modulator 20 is chosen to be m-bits (where $m \geq 1$ and is more than one bit in a preferred embodiment) because, as the number of bits is increased, the clock rate necessary to operate sigma-delta modulator 20 can be reduced. However, it is to be appreciated that the invention is not so limited. Sigma-delta modulator 20 could also be a one bit modulator if the clock frequency used to run the modulator is increased as necessary.

A key feature of the present invention as a whole and in particular circuit part 13 is that the temporal spacing of the sampling points is controlled by the n-th order m-bit sigma-delta modulator such that any errors (i.e., noise on the sampling points) produced by this non-uniform sampling are shaped in the frequency domain. As is well-known in the field of sigma-delta systems, this noise produced by errors resulting from the non-uniform sampling can be removed by conventional digital filtering techniques.

Several other advantages are also obtained. By appropriate choice of the rate at which the sigma-delta spaced sampling points are generated and the number of bits used in controlling the spacing of these sampling points, the signal to noise ratio of the digital data stream on line 14 can be controlled. Further degrees of freedom are available by varying the order of the sigma-delta modulator used to control the oversampling ratio. In another aspect of the invention, the degree of filtering used on the digital data stream on line 17 can also be varied to vary the signal-to-noise ratio as well.

The digital data at the predetermined data rate on line 14 is optionally filtered by a filter 11 depending on the performance requirements of the particular application. Filter 11 removes any sigma-delta noise on the digital data stream on line 14 as a result of the sigma-delta modulator's control of decimation block 21. Filter 11 may be a sinc-type filter, such as a sinc $96^4$ filter, well known to those skilled in the art. The filtered data from filter 11 on line 28 is sent to circuit part 15 of circuit 10.

In circuit part 15 of the circuit 10 illustrated in FIG. 2, the filtered digital data stream on line 28 is then sent to interpolator 30. Interpolator 30 increases the sample rate of the digital data stream (that is, converts the digital data stream into a higher sample rate digital data stream) on line 28 by using a sample and hold technique that repeats the digital sample for a specified number of clock cycles in a manner well-known to those skilled in the art. One skilled in the art will appreciate that other techniques may be used for increasing the sample rate of the data stream on line 28, such as interpolation techniques that insert zeroes between data samples. The purpose of interpolator 30 is to increase the sample rate of the digital data stream on line 28 to create an oversampled signal.

The interpolation ratio (i.e., the ratio by which the sample rate of the digital data on line 28 is increased by interpolator 30) is controlled by a sigma-delta modulator 32. Sigma-delta modulator 32 may be the same type of modulator as sigma-delta modulator 20.

A higher sample rate digital data stream on line 34 is then sent to a digital filter 36 which removes any images of the original digital signal as a result of the interpolation process. The filtered digital data stream on line 38 is then sent to a decimation block 40 that decimates the digital data stream on line 38 by a fixed decimation ratio to produce the digital data stream on line 42 having a sample rate (Fs2) selected by a sampling frequency select signal 44. Although filter 36 and decimation block 40 have been illustrated as separate circuit elements for illustrative purposes, one skilled in the art will appreciate that these functions may be performed by a single computational element, such as an FIR or IIR filter in a well known manner.

The sigma-delta modulator 32 produces digital data at the frequency of clock 22, the data controlling the interpolation of interpolator 30. As will be explained in more detail hereinafter, the sigma-delta modulator 32 sigma-delta modulates a signal 44 representative of the desired output sample rate (Fs2) of the digital data stream on line 42. An example will serve to illustrate this function. Assume that the data rate of the digital data stream on line 28 is 3.072 MHz. Assume the frequency of clock 22 is 3.072 MHz. If the desired data rate of the data stream on line 42 is 32 kHz, signal 44 is therefore a multi-bit digital number representative of a sampling rate of 32 kHz where the number of bits in the digital number control the precision with which the data rate (Fs2) of the data stream on line 42 can be specified. This digital number is sigma-delta modulated by the sigma-delta modulator 32 and used to control interpolator 30 to increase the sample rate of the digital data stream on line 28 by a factor of four. Interpolator 28 increases this data rate to 12.288 MHz by interpolating the data by a factor of four. The resulting 12.288 MHz data is then decimated, after filtering by filter 36, by a factor of 384 (decimator 40 having a decimation ratio of 384) and the digital data stream emerging on line 42 is therefore at, on average, a 32 kHz data rate.

Sigma-delta modulator 32 is preferably an n-th order m-bit sigma-delta modulator. The higher the order of the sigma-delta modulator, the better the noise shaped characteristics of the output signal on line 42. The signal on line 46 output by sigma-delta modulator 32 is chosen to be m-bits (where $m \geq 1$ n and is more than one bit in a preferred embodiment) because, as the number of bits which control interpolator 30 is increased, the clock rate necessary to operate sigma-delta modulator 32 can be reduced. However, it is to be appreciated that the invention is not so limited. Sigma-delta modulator 32 could also be a one bit modulator if the clock frequency used to run the modulator is increased as necessary.

A key feature of the present invention is as a whole (as discussed previously) and circuit part 15 in particular that the temporal spacing of the sampling points is controlled by the n-th order m-bit sigma-delta modulator such that any errors (i.e., noise on the sampling points) produced by this non-uniform sampling are shaped in the frequency domain. As is well-known in the field of sigma-delta systems, this noise produced by errors resulting from the non-uniform sampling can be removed by conventional digital filtering techniques.

Several other advantages are also obtained. By appropriate choice of the rate at which the sigma-delta spaced sampling points are generated and the number of bits used in controlling the spacing of these sampling points, the signal-to-noise ratio of the digital data stream on line 42 can be controlled. Further degrees of freedom are available by varying the order of the sigma-delta modulator used to control the oversampling ratio. In another aspect of the invention, the degree of filtering used on the digital data stream on line 34 can also be varied to vary the signal-to-noise ratio as well.

Figure 3:
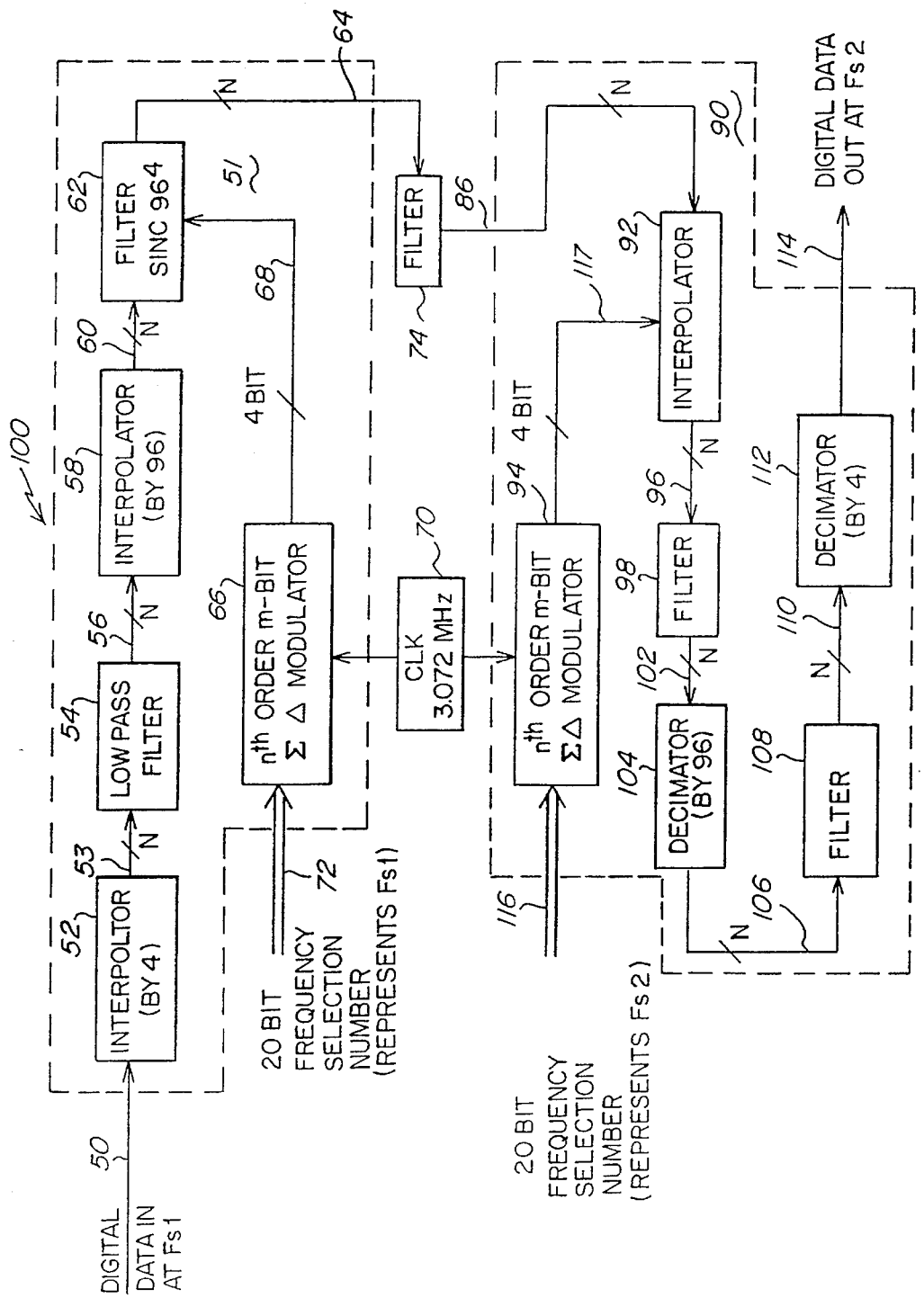
FIG. 3 is a more detailed block diagram of the circuit of FIG. 2.

FIG. 3 illustrates a more detailed embodiment of the digital-to-digital converter of FIG. 2. In circuit 100, circuit part 51 is analogous to circuit part 13 in FIG. 2 and circuit part 90 is analogous to circuit part 15 in FIG. 2. In the circuit 100 of FIG. 2, an n-bit wide digital data stream on line 50 which may be, for example, in the range of 4 kHz to 48 kHz is received by interpolator 52. Interpolator 52 increases the sample rate (Fs1) of digital data stream on line 50 by a factor of four using, for example, a zero fill technique that inserts zeros between the digital samples. The higher sample rate signal output by interpolator 52 (now in the range of 16 kHz to 192 kHz) is then fed into a digital low pass filter 54 which may be, for example, a finite impulse response type filter. Low pass filter 54 filters out of band images of the digital signal on line 50 out of the digital data stream on line 53. The filtered digital data stream on line 56 from low pass filter 54 is then fed into interpolator 58 that increases the sample rate of the digital data stream on line 56 by a factor of ninety-six. Inserting ninety-five zeros into the digital data stream on line 56 will reduce the gain of the original signals because of the dilution of the signal by the inserted zeros. However, as is well-known, the parameters of filter 62 can be adjusted to compensate for this loss of gain. The higher sample rate digital data signal on line 60 (now in the range of 1.536 MHz to 18.432 MHz) provided by interpolator 58 is fed into digital filter 62.

As stated previously, other techniques, such as sample and hold techniques, may be used to increase the sample rate in place of interpolators 52, 58. The use of a sample and hold technique is advantageous because it automatically compensates for the energy lost in creating the images of the original signal due to the interpolation process.

In one embodiment, digital filter 62 is a sinc $96^4$-type filter that is designed to have zeros at the image frequencies of the digital data stream on line 60. Filter 62 could, however, be any type of IIR or FIR filter. In the embodiment illustrated in FIG. 3, digital filter 62 provides both a low pass filtering function and a decimation function. One skilled in the art will appreciate that these two functions could be separated in the manner illustrated in FIG. 2. As will be explained in greater detail hereinafter, filter 62 outputs a digital data stream on line 64 at 3.072 MHz.

It is to be noted that the digital data streams on lines 53, 56, 60, and 64 are indicated as being n-bits wide in FIG. 3. N may be any number of bits and is typically chosen to be the widest bit stream commensurate with the signal-to-noise ratio requirements of the particular application. Furthermore, the digital data streams may be different widths on each of the lines.

The n-th order m-bit sigma-delta modulator 66 provides a four-bit number on line 68 that controls filter 62 to produce the output data stream on line 64. Sigma-delta modulator 66 is, in one embodiment, a third order four-bit modulator. Sigma delta modulator 66 is clocked using a 3.072 MHz clock 70.

In one embodiment, a twenty-bit frequency selection number 72 (representing Fs1) is input into sigma-delta modulator 66. Frequency selection number 72 ranges from $-2^{19}$ to $+2^{19}$. This twenty-bit number controls the precision with which the four-bit number output by sigma-delta modulator 66 represents the sampling rate (Fs1) of the input digital data stream on line 50. Sigma-delta modulator 66 modulates the twenty-bit number to produce sigma-delta modulated four-bit codes that control filter 62. The first bit of the code is a sign bit. The remaining three bits produce codes that direct the filter 62 to calculate and produce an output every P samples of the data stream on line 60, effectively sample rate converting the data stream.

Table 1 illustrates the relationship among the four-bit codes that are produced by sigma-delta modulator 66, the intervals at which filter 62 produces an output, and the sampling frequency that the four-bit code corresponds to when modulator 66 is clocked using a 3.072 MHz clock. Some examples will illustrate the operation of this part of the system.

TABLE 1

| 4 BIT CODE | PRODUCE AN OUTPUT EVERY P SAMPLES | CORRESPONDING TO SAMPLING FREQUENCY OF (KHZ) |
| --- | --- | --- |
| +4 | 8 | 64 |
| +3 | 7 | 56 |
| +2 | 6 | 48 |
| +1 | 5 | 40 |
| 0 | 4 | 32 |
| −1 | 3 | 24 |
| −2 | 2 | 16 |
| −3 | 1 | 8 |
| −4 | 0 | DC |

Assume, for purposes of illustration, that the digital data stream on line 50 has a data rate (Fs1) of 48 kHz. Interpolator 52 increases this data rate to 192 kHz. Interpolator 58 increases the 192 kHz sampling rate to 18.432 MHz. To produce the digital data stream on line 64 at 3.072 MHz at the output of filter 62 (i.e, at the clock rate of the clock controlling sigma-delta modulator 66), the digital data stream on line 60 at 18.432 MHz must be decimated by a factor of six. Therefore, twenty-bit frequency selection number 72 is selected such that upon sigma-delta modulation by the third order four-bit sigma-delta modulator 66, the four bit codes generated will be, on average, a +2 code although other four bit codes will be produced but with a lower frequency of occurrence.

A key point to remember is that the +2 code is the resulting average of all the codes produced by sigma-delta modulator 66 upon sigma-delta modulation of twenty-bit frequency selection number 72. A +2 code is not produced every time sigma-delta modulator 66 is clocked even though the input sample rate (Fs1) and the output sample rate of the data stream on line 64 are related to each other by an integer multiple. Even if the sample rates were related to each other by an integer multiple, any errors, no matter how small, that result in a temporal displacement between the sample points in the input digital data stream on line 50 and the sample points in the rate-converted digital data stream on line 64 would increase the signal-to-noise ratio to a point where the conversion process would not be acceptable. In the present invention, the time base (i.e., the temporal spacing between samples) is sigma-delta modulated so that the errors due to temporal displacement between the input and rate-converted digital data stream that cause noise are pushed into a higher frequency range. This noise is then removed by conventional filtering techniques such as in filter 74.

As shown in Table 1, the +2 (on average) code directs filter 62 to produce an output every six data samples of digital data stream on line 60. This results in the output data stream on line 64 having a data rate (i.e., a sample rate or sampling frequency) of 3.072 MHz on average.

In another example, assume that the digital data stream on line 50 has a data rate (i.e., a sample rate or sampling frequency) (Fs1) of 4 kHz. Interpolator 52 increases this data rate to 16 kHz. Interpolator 58 increases the 16 kHz data rate to 1.536 MHz. In order that the digital data stream on line 64 have a data rate of 3.072 MHz (i.e., the clock rate of the clock controlling sigma-delta modulator 66), the digital data stream on line 60 at 1.536 MHz must be effectively interpolated by a factor of 2. Therefore twenty-bit frequency selection number 72 (representing Fs1) is chosen such that sigma-delta modulator 66 produces, on average, an equal number of −3 and −4 codes although other four bit codes will be produced, but with a lower frequency of occurrence. That is, occasionally, −2, −1, and even less frequently, +1, +2 codes will be produced. As shown in Table 1, the −3 code directs sinc filter 62 to produce an output for each input sample corresponding to a sampling frequency of 8 kHz for the clock frequencies and interpolation ratios illustrated.

The −4 code is used to control filter 62 so that it does not produce a new output but rather repeats the previous output. That is, the filter 62 is directed to produce an output, but since a new data point has not been received and the previous data point is still at the filter input, the filter 62 repeats the calculation and produces the same output again.

At the illustrated interpolation ratios and clock frequencies, the −3 code represents a sampling frequency of 8 kHz and the −4 code represents a sampling frequency of DC (i.e., no signal). Therefore, on an average of many samples, the −3 and −4 four-bit codes produce a sampling frequency of 4 kHz to provide a digital data stream on line 64 at 3.072 MHz.

One skilled in the art will appreciate that any sampling frequencies within the 0 to 64 kHz range may be produced by varying the ratio of four-bit codes produced by sigma-delta modulator 66. For example, to obtain a sampling frequency between 56 kHz and 64 kHz, the appropriate ratio of +and +4 codes would be output by sigma-delta modulator 66 as a function of twenty-bit number 72. One skilled in the art will also appreciate that any sample rate within the working range of the system can be produced through the appropriate combination of four-bit codes.

Although modulator 66 has been illustrated as a four-bit sigma-delta modulator, the invention is not so limited. For example, a sigma-delta modulator that outputs fewer bits can be used if the clock rate of the clock supplied to the modulator is increased as necessary. In the same manner, a sigma-delta modulator that outputs a larger number of bits can be used and the modulator can then be clocked at a lower rate. One skilled in the art will appreciate the number of bits used and the clock rate used are a function of the desired noise shaping and signal to noise ratio, and may be traded-off depending upon the requirements of a particular application.

One of the advantages of sigma-delta modulation of the time base is that the jitter or time variation produced on the sampling time (or sampling interval) due to the fact that digital filter 62 or decimator 21 (under control of sigma-delta modulator 20 or 66) respectively produces output samples at time intervals that may not correspond exactly to the specified sampling frequency (the 3.072 MHz clock rate in the illustrated embodiments) is varied by the sigma-delta modulator so that any noise that result from the error or jitter around the sampling point has a sigma-delta characteristic that can be removed by conventional filtering techniques, as for example, by filter 74.

Figure 1:
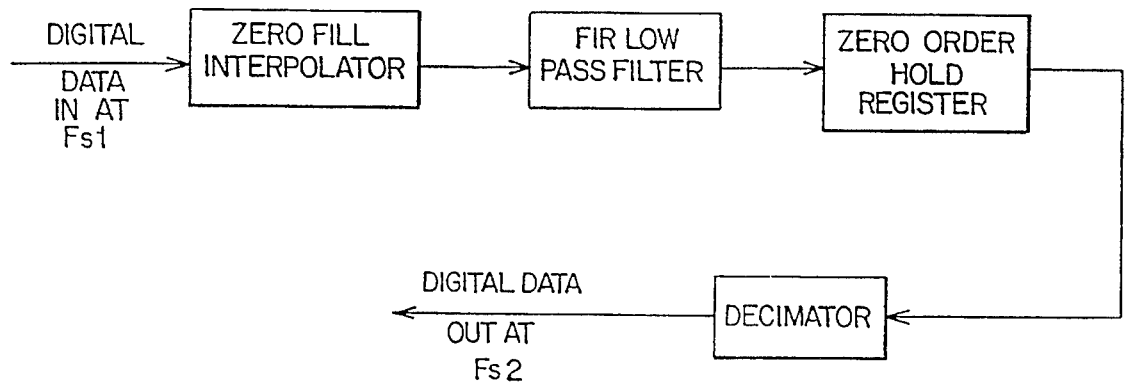
FIG. 1 is a block diagram of a conventional digital-to-digital converter.
Figure 4:
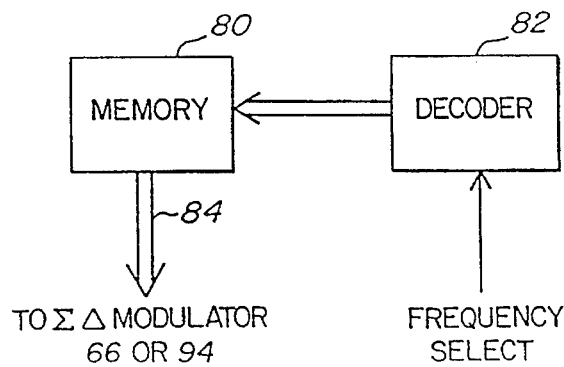
FIG. 4 is a block diagram of a circuit for supplying previously stored frequency numbers to the n-th order m-bit sigma-delta modulator of FIGS. 2–3 and 5–5A.

FIG. 4 is a block diagram of an alternative system for determining frequency selection number 72. In FIG. 4, a memory 80 (which may be RAM or ROM, for example) is used to store a look up table containing twenty-bit numbers and the sampling frequency to which they correspond. In response to a frequency select signal from a user or an external source, decoder 82 selects the twenty-bit number from memory 80 most closely corresponding to the desired sampling frequency specified by the frequency select signal. The twenty-bit number is then output on bus 84 to sigma-delta modulator 66.

The sample rate converted digital data stream on line 64 optionally is sent to filter 74 which operates in a manner analogous to filter 11 in FIG. 2. That is, depending on the performance requirements of the particular application, filter 74 may be used to filter out sigma-delta noise on the digital data stream on line 64 as a result of sigma-delta modulation control of sinc filter 62. In one embodiment of the invention, filter 74 may be a sinc-type filter, such as a sinc $96^4$-type filter. The filtered digital data stream having a data rate of 3.072 MHz on line 86 is then fed into circuit part 90 of circuit 100.

The filtered digital data stream on line 86 is then sent to interpolator 92. Interpolator 92 increases the sample rate of the digital data stream on line 86 by using a sample and hold technique or an interpolation technique under control of sigma-delta modulator 94. The use of a sample and hold technique is advantageous because it automatically compensates for the energy lost in creating the images of the original signal due to the interpolation process. One skilled in the art will appreciate that other techniques, such as interpolation techniques that insert zeroes between data samples may be used to increase the sample rate of the data stream on line 86. The higher rate digital data stream on line 96 is then sent to low-pass filter 98 that removes images and sigma-delta noise from the digital data stream on line 96 that may be present as a result of the interpolation process. In one embodiment, digital filter 98 is a sinc $96^3$-type filter. Filter 52 could, however, be any type of IIR or FIR filter.

The filtered digital data stream on line 102 is then sent to a decimation block 104 that decimates the digital data stream on line 102 by a fixed decimation ratio (96 in the illustrated embodiment). The decimated digital data stream on line 106 is then filtered by low pass filter 108 to remove images and sigma-delta noise as a result of the non-uniform sampling. The filtered digital data stream on line 110 is then sent to a decimation block 112 that decimates the digital data stream on line 110 by a fixed decimation ratio (4 in the illustrated embodiment) to provide the digital data stream on line 114 at the data rate (Fs2) selected by a 20 bit sampling frequency selection number 116.

It is to be noted that the digital data streams on lines 86, 96, 102, 106, and 110 are indicated as being n-bits wide in FIG. 3. N may be any number of bits and is typically chosen to be the widest bit stream commensurate with the signal-to-noise ratio requirements of the particular application. Furthermore, the digital data streams may be different widths on each of the lines.

The n-th order m-bit sigma-delta modulator 94 provides a four-bit number on line 116 that controls interpolator 92 to produce the digital data stream on line 96. In one embodiment, sigma-delta modulator 94 is a third order four-bit modulator. Sigma-delta modulator 94 is also clocked using the 3.072 MHz clock 70.

In one embodiment, a twenty-bit frequency selection number 116 (representing Fs2) is input into sigma-delta modulator 94. Frequency selection number 116 ranges from $-2^{19}$ to $+2^{19}$. This twenty-bit number controls the precision with which the four-bit number output by sigma-delta modulator 94 represents the desired sampling rate (Fs2) of the output digital data stream on line 114. Sigma delta modulator 94 modulates the twenty-bit number to produce sigma-delta modulated four-bit codes that control interpolator 92. The first bit of the code is a sign bit. The remaining three bits produce codes that control the interpolation ratio (i.e., the factor by which the sample rate of the digital data stream on line 86 is increased) provided by interpolator 92 to effectively convert the sample rate of the data stream.

Table 2 illustrates the relationship among the four-bit codes that are produced by sigma-delta modulator 94, the ratio by which the sample rate of the digital data stream on line 86 is increased, and the sampling frequency that the four-bit code corresponds to when modulator 94 is clocked using a 3.072 MHz clock. Some examples will illustrate the operation of this part of the system.

TABLE 2

| 4 BIT CODE | SAMPLE RATE INCREASE FACTOR | CORRESPONDING TO SAMPLING FREQUENCY OF (kHz) |
|---|---|---|
| +4 | 8 | 64 |
| +3 | 7 | 56 |
| +2 | 6 | 48 |
| +1 | 5 | 40 |
| 0 | 4 | 32 |
| −1 | 3 | 24 |
| −2 | 2 | 16 |
| −3 | 1 | 8 |
| −4 | 0 | DC |

Assume, for purposes of illustration, that the sample rate of the digital data stream on line 86 is an oversampled data stream having a constant sample rate of 3.072 MHz as a result of the interpolation/decimation process performed by circuit part 51 on the digital data stream on line 50. Assume that the desired sample rate (Fs2) of the digital data stream on line 114 is 32 kHz. To produce the digital data stream on line 114 at 32 kHz, the digital data stream on line 110 must have a sample rate of 128 kHz and the digital data stream on line 96 must have a sample rate of 12.288 MHz. Therefore, twenty-bit frequency selection number 116 is selected such that upon sigma-delta modulation by the third order four-bit sigma-delta modulator 94, the four-bit codes generated will be, on average, a 0 code, although other four-bit codes will be produced but with a lower frequency of occurrence.

Interpolator 92 uses, in one embodiment, a sample and hold technique under control of sigma-delta modulator 94 to increase the sample rate of the digital data stream on line 86. The use of a sample and hold technique is advantageous because it automatically compensates for the energy lost in creating the images of the original signal due to the interpolation process.

A key point to remember is that the 0 code is the resulting average of all codes produced by sigma-delta modulator 94 upon sigma-delta modulation of twenty-bit frequency selection number 116. A 0 code is not produced every time sigma-delta modulator 94 is clocked even though the sample rate of the digital data stream on line 86 and the sample rate of the digital data stream on line 114 are related to each other by an integer multiple. Even if the sample rates were related to each other by an integer multiple, any errors, no matter how small, that result in a temporal displacement between the sample points in the digital data stream on line 86 and the sample points in the rate-converted digital data stream on line 96 would increase the signal-to-noise ratio to a point where the conversion process would not be acceptable. In the present invention, the time base (i.e., the temporal spacing between samples) is sigma-delta modulated so that the errors due to temporal displacement between the digital data stream on line 86 and the rate-converted digital data stream on line 96 that cause noise are pushed into a higher frequency range. This noise is then removed by conventional filtering techniques such as in digital filters 98 and 108.

As shown in Table 2, the 0 code (on average) directs interpolator 92 to increase the sample rate of the digital data stream on line 86 by a factor of four. Interpolator 92 uses, in one embodiment, a sample and hold technique under control of sigma-delta modulator 94 to increase the sample rate of the digital data stream on line 86. The use of a sample and hold technique is advantageous because it automatically compensates for the energy lost in creating the images of the original signal due to the interpolation process. Alternatively, interpolator 92 may increase the sample rate by interpolation using a zero fill technique to insert four zeros between every sample of the digital data stream on line 86. Inserting zeros into the digital data stream on line 86 will reduce the gain of the original signals because of dilution of the signal. The higher sample rate digital data stream on line 96 has a sample rate of, on average, 12.288 MHz in this example. Upon decimation by decimator circuit 104 and decimator circuit 112, the digital data stream on line 114 emerges with a sample rate of, on average, 32 kHz.

In another example, assume that the desired sample rate of the digital data stream on line 114 is 4 kHz. To produce the digital data stream on line 114 at 4 kHz, the digital data stream on line 110 must have a sample rate of 16 kHz and the digital data stream on line 96 must have a sample rate of 1.536 MHz. Therefore, 20-bit frequency selection number 116 is selected such that sigma-delta modulator 94 produces, on average, an equal number of −3 and −4 codes, although other 4-bit codes will be produced, but with a lower frequency of occurrence. As shown in Table 2, the −3 code directs interpolator 92 not to increase the sample rate (because the sample rate increase factor is 1). This corresponds to a sampling frequency of 8 kHz for the clock frequencies and interpolation ratios illustrated.

The −4 code controls interpolator 92 to increase the sample rate of the digital data stream by a factor of zero. That is, interpolator 92, in response to a −4 code, produces no output, thus effectively decimating the digital data stream on line 86.

At the illustrated interpolation ratios and clock frequencies, the −3 code represents a sampling frequency of 8 kHz and the −4 code represents a sampling frequency of DC (i.e., no signal). Therefore, on average of many samples, the −3 and −4 4-bit codes represent a sampling frequency of 4 kHz. Thus, on average of many samples, after decimation by decimator 104 and decimator 112, the data rate of the digital data on line 114 will be, on average, 4 kHz.

One skilled in the art will appreciate that any sampling frequencies within the 0 to 64 kHz range may be produced by varying the ratio of four-bit codes produced by sigma-delta modulator 94. For example, to obtain a sampling frequency between 56 kHz and 64 kHz, the appropriate ratio of ∓ and +4 codes would be output by sigma-delta modulator 94 as a function of twenty-bit number 116. One skilled in the art will also appreciate that any sample rate within the working range of the system can be produced through the appropriate combination of four-bit codes.

Although a four-bit sigma-delta modulator has been illustrated, the invention is not so limited. For example, a sigma-delta modulator that outputs fewer bits can be used if the modulator is clocked at a faster rate. In the same manner, a sigma-delta modulator that outputs a larger number of bits can be used and the modulator can then be clocked at a lower rate. One skilled in the art will appreciate that the number of bits used and the clock rate used are a function of the desired noise shaping and signal-to-noise ratio and may be traded off depending upon the requirements of a particular application.

As previously discussed with respect to circuit part 51, one of the advantages of sigma-delta modulation of the time base in circuit part 90 is that the jitter or time variation produced on the sampling time (or sampling interval) due to the fact that interpolator 92 (under control of sigma-delta modulator 94) produces output samples at time intervals that may not correspond exactly to the specified output sampling frequency (0 kHz to 64 kHz in the illustrated embodiment) on line 116 is varied by the sigma-delta modulator so that any noise that results from the error or jitter around the sampling point has a sigma-delta characteristic that can be removed by conventional filtering techniques, as for example, by filter 98.

The alternative system for determining a frequency selection number as illustrated in FIG. 4 can also be used to determine 20 bit frequency selection number 116 in the same manner.

Figure 5:
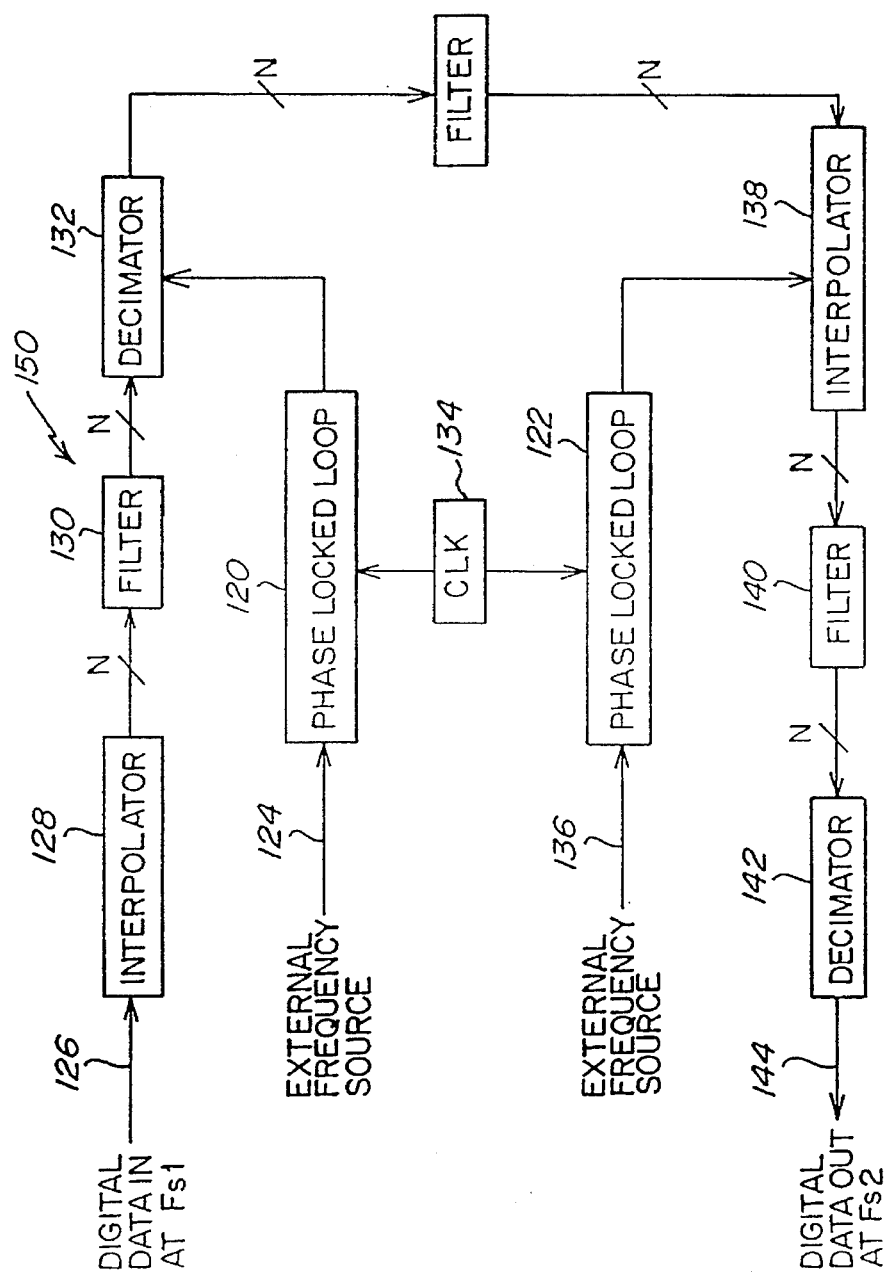
FIG. 5 is a block diagram illustrating a locking circuit in the circuits of FIGS. 2–3.

FIG. 5 illustrates another embodiment of the invention in which digital phase locked loops 120 and 122 are incorporated into the circuits of FIGS. 2 or 3. The phase locked loops allow the digital-to-digital converter to operate at and lock to external clock signals, such as off-chip signals. Phase locked loop 120 locks to and tracks an external frequency source on line 124. The frequency source on line 124 may be the sampling frequency select signal or the twenty bit frequency selection number illustrated in FIGS. 2 and 3, respectively. The frequency source on line 124 may be a clock running at the data rate (Fs1) of the digital data coming into the circuit on line 126. Alternatively, the frequency source on line 124 may be a clock from the circuit that supplies the digital data on line 126 at a data rate of Fs1. Therefore, phase locked loop 120 will track changes in the clock that controls the data rate of the digital data on line 126, thus allowing this part of the circuit to respond to an external frequency source. In this way, the first part of circuit 150 including interpolator 128, filter 130, and decimator 132 can be made to track the clock that controls the data rate of the digital data on line 126, thus allowing this part of the circuit to operate independent of the clock rate of clock 134. In a like manner, phase locked loop 122 responds to an external frequency source on line 136 to control interpolator 138, filter 140, and decimator 142. The frequency source on line 136 may be the sampling frequency select signal or the twenty bit frequency selection number illustrated in FIG. 2 and 3, respectively. The external frequency source on line 136 is typically a clock running at the desired output data rate (Fs2) of the digital data on line 144. In this manner, the data rate of the digital data on line 144 can be made to be independent of the clock rate of clock 134, since the phase locked loop 122 locks to and tracks the frequency of the external frequency source on line 136.

Figure 5A:
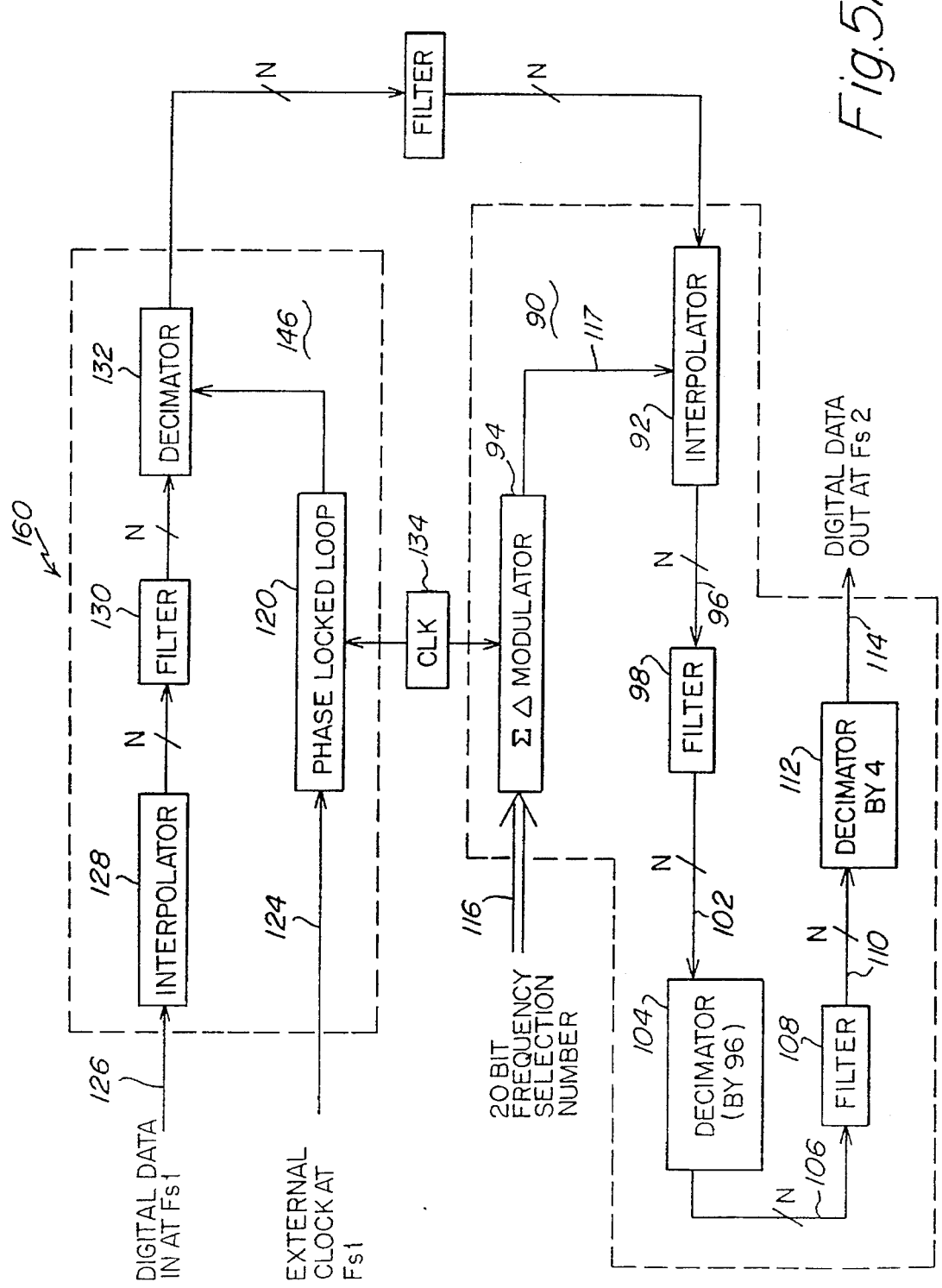
FIG. 5A is a block diagram illustrating the use of a combination of a locking circuit and a sigma-delta modulator in the circuits of FIGS. 2–3.

FIG. 5A illustrates another embodiment of the invention in which phase locked loop 120 receives, on line 124, an external frequency source having a frequency equal to the clock rate of the digital data stream being supplied to interpolator 128. Since phase locked loop 120 responds to a clock having the data rate of the incoming digital data stream, any changes in the frequency of the digital data on line 126 are tracked by phase locked loop 120, thereby keeping the operation of interpolator 128, filter 130, and decimator 132 in synchronism with the data rate of the incoming digital data on line 126. The circuit of FIG. 5A also includes the sigma-delta modulator and variable interpolation/fixed decimation circuitry 90 illustrated in FIG. 3. This portion of the circuitry of FIG. 5A operates in the manner described in conjunction with FIG. 3. The circuit of FIG. 5A is advantageous in that the fixed interpolation, variable decimation portion can be locked to the data rate of the incoming digital data stream. The data rate of the outgoing digital data stream on line 114 is controlled by the 20 bit frequency selection number 116. Thus, both portions 146 and 90 can respectively receive data and output data independent of the clock rate of clock 134. In addition, the data rate of the digital data on line 114 can be independent of and unrelated to the data rate of the digital data on line 126. These same advantages also are provided by the circuit of FIG. 5. One skilled in the art will appreciate that FIGS. 5 and 5A are exemplary and that phase locked loops and sigma-delta modulators can be combined in other ways in accordance with the present invention.

Figure 6:
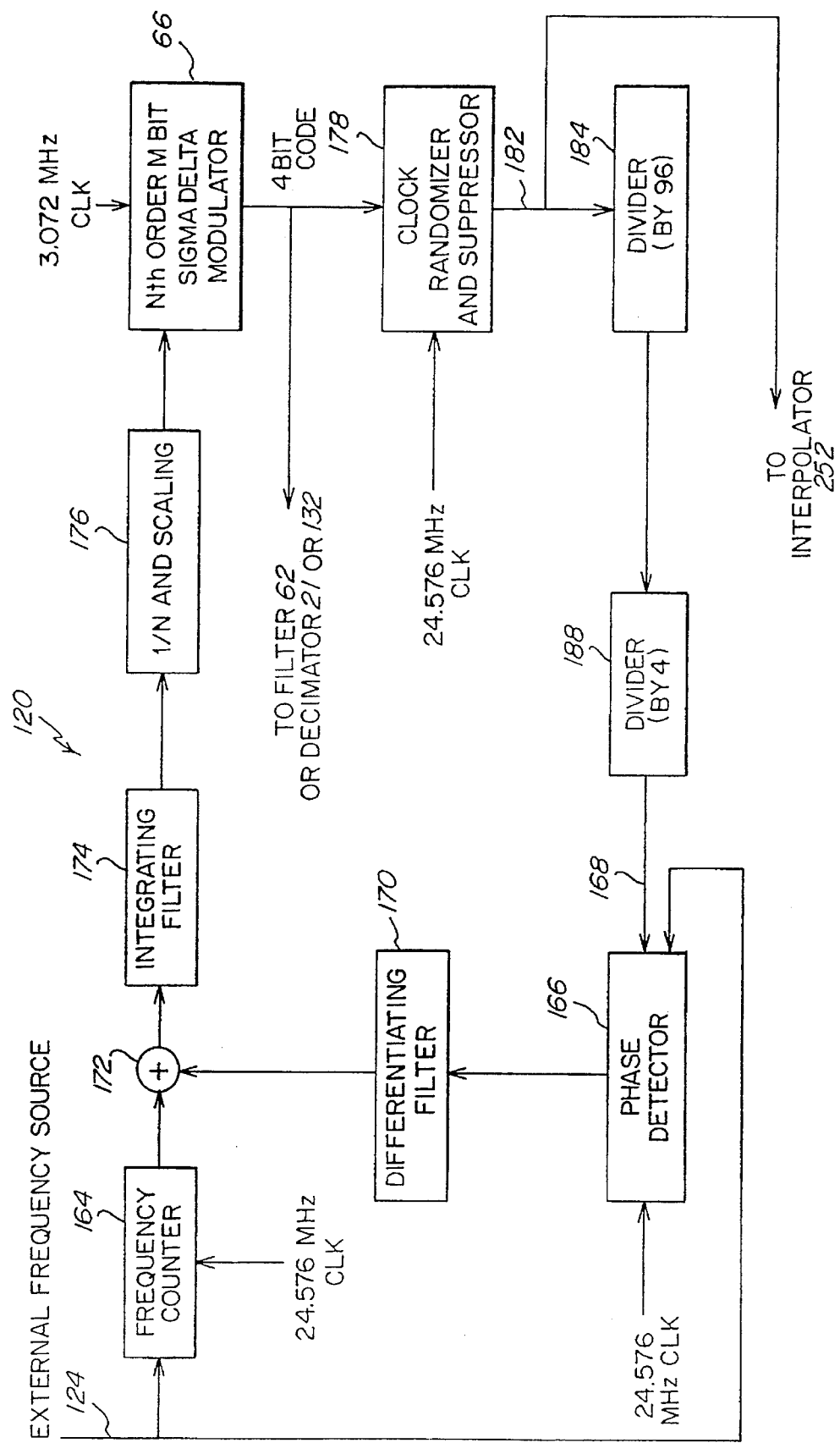
FIG. 6 is a block diagram of a locking circuit that may be used in conjunction with the circuits of FIGS. 2–3 and 5–5A to lock the digital-to-digital converter to an externally supplied clock signal.

FIG. 6 illustrates a detailed embodiment of phase locked loop 120 of FIG. 5. Digital phase locked loop 120 incorporates a sigma-delta modulator such as sigma-delta modulator 20 or 66.

In circuit 120, an external clock source on line 124 is applied to a frequency counter 164 that produces a signal representative of the period of the external frequency source on line 124. In addition, the external clock on line 124 is applied to a phase detector 166 that produces a signal proportional to the phase difference between the external clock on line 124 and a signal on line 168 to be described in more detail hereinafter. The output of the phase detector 166 is filtered by differentiating filter 170 and summed in summer 172 with the signal representative of the period of the external clock source on line 124 from the frequency counter 164. The output of summer 172 is fed into an integrating filter 174 that functions as a low-pass filter. The output of integrating filter 174 is then sent to a circuit 176 that converts the period to a frequency by performing a 1/period function and providing any application dependent scaling of the frequency signal. The signal from circuit 176 is then sent to sigma-delta modulator 66. The four-bit code from sigma-delta modulator 66 is used to control decimator 132 or decimate block 21 or sinc filter 62 in the same manner as described in connection with the embodiment of FIGS. 2 and 3, respectively.

The four-bit code is also fed into a clock generation circuit 178 that effectively produces an output clock at 384 times greater than the signal on line 124. Circuit 178 performs this function by suppressing a certain number of 24.576 MHz clock cycles in response to the four-bit code from sigma-delta modulator 66. The following examples will serve to illustrate. Assume sigma-delta modulator 66 is clocked by a 3.073 MHz clock. For every 3.072 MHz clock, there are eight 24.576 MHz clocks applied to circuit 178. In accordance with Table 1, circuit 178 suppresses a number of 24.576 MHz clocks as a function of the four bit code by sigma-delta modulator 66. For example, if the external frequency source on line 162 is 48 kHz, then sigma-delta modulator 66 outputs, on average, a +2 code. The +2 code directs circuit 178 to allow six out of every eight 24.576 MHz clocks to pass through. Stated another way, circuit 178 suppresses two out of every eight 24.576 MHz clocks in response to a +2 code.

If the external clock frequency source is 4 kHz, then sigma-delta modulator 66 outputs, on average, an equal number of –3 and –4 codes. The –3 code directs circuit 178 to allow one out of every eight 24.576 MHz clocks to pass through (i.e., circuit 178 suppresses seven out of every eight 24.576 MHz clocks in response to a –3 code). The –4 code directs circuit 178 to allow no 24.576 MHz clocks to pass through (i.e., circuit 178 suppresses eight out of every eight 24.576 MHz clocks in response to a –4 code). On average, therefore, one out of every sixteen 24.576 MHz clocks will pass through suppressor circuit 178 in response to an average of –3 and –4 codes.

If, however, the same clocks are suppressed for each four-bit code from sigma-delta modulator 66, then unwanted tones may appear in the output data stream on line 182. Therefore, circuit 178 also performs the additional function of randomly suppressing clock cycles in order to prevent unwanted tones in the output data stream on line 182. Randomizing ensures that pulses in each of the eight positions (recall that there are eight 24.576 MHz clock pulses for each 3.072 MHz clock pulse controlling sigma-delta modulator 66) are suppressed equally, on average. This may be accomplished by providing a latch for each bit position that is set whenever the pulse in that position is suppressed. Pulses in that position are not suppressed again until all latches corresponding to all the positions have been set, at which time the latches are cleared and the sequence of suppression is repeated. This reduces tones that result from the clock pulse suppressor. Clock suppressor circuits are well-known in the art. One example of such a circuit may be found in *Phase Locked Loops, Theory, Design, and Applications* by Dr. Roland E. Best, published by McGraw-Hill Book Company, © 1984. Clock randomizer/suppressor circuit 178 outputs a clock signal on line 182 that is sent through divider 184 having a divider ratio of 96 and a divider 188 having a divider ratio of 4 that reduce the suppressed and randomized 24.576 MHz clock output by clock randomizer circuit 178 to the frequency of the external clock on line 124. Circuits 184 and 188 may be counters.

For the examples just discussed above, if the external clock on line 124 is 48 kHz, then the signal on line 182 is approximately 18.432 MHz. When divided by ninety-six and then four, the signal on line 168 is 48 kHz. If the external clock on line 124 is 4 kHz, then the signal on line 182 is approximately 1.536 MHz. When divided by ninety-six and then four, the signal on line 168 is 4 kHz.

Circuit 176, sigma-delta modulator 66 and clock randomizer/suppressor circuit 178 together form a digitally-controlled oscillator.

Figure 7:
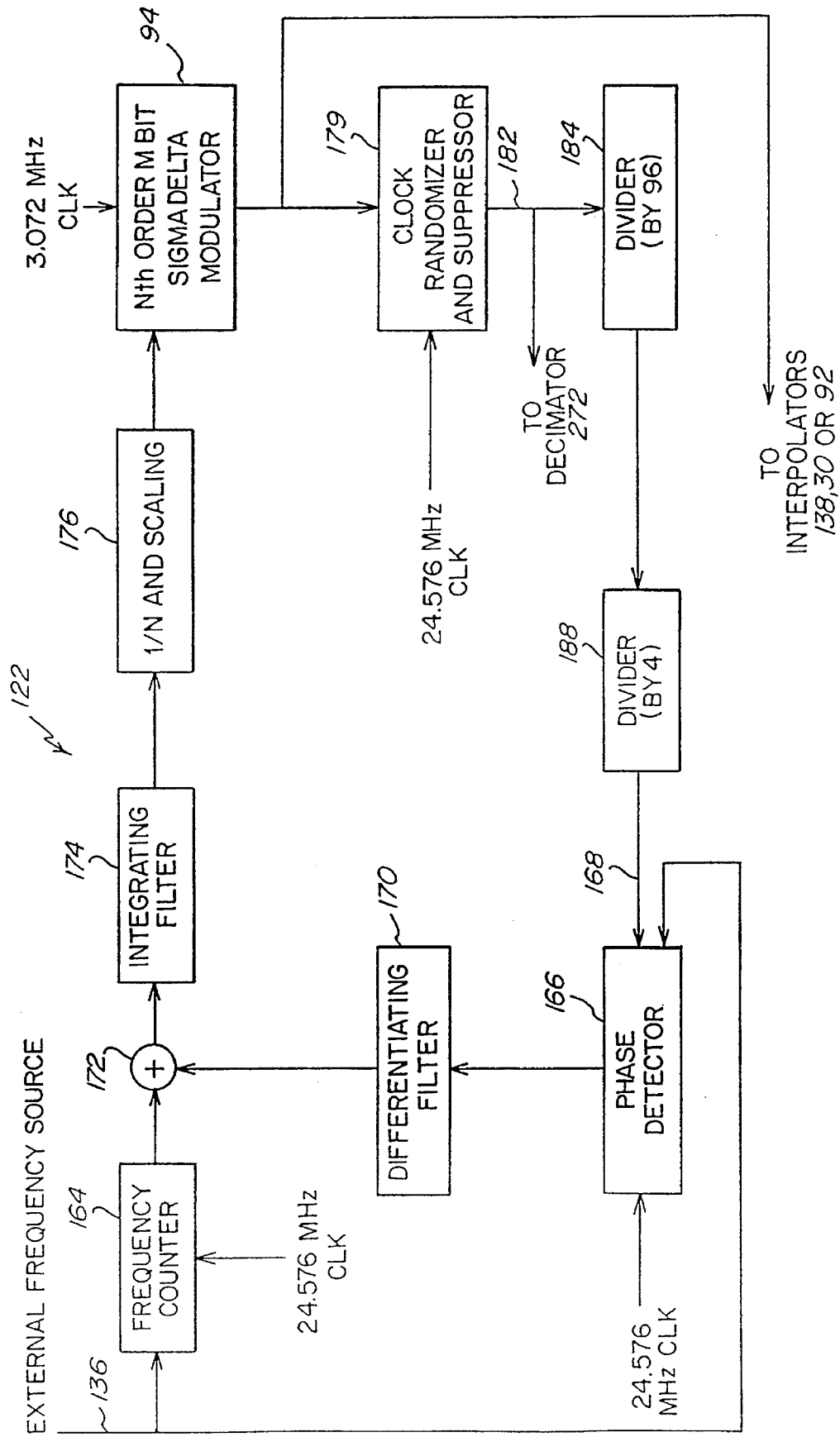
FIG. 7 is a block diagram of a second locking circuit that may be used in conjunction with the circuits of FIGS. 2–3 and 5–5A to lock the digital-to-digital converter to an externally supplied clock signal.

FIG. 7 illustrates one embodiment of the phase locked loop 122 used in the circuit of FIG. 5. Phase locked loop 122 is the same as phase locked loop 120.

In circuit 122, an external clock source on line 136 is applied to a frequency counter 164 that produces a signal representative of the period of external frequency source on line 136. In addition, the external clock on line 136 is applied to phase detector 166 that produces a signal proportional to the phase difference between the external clock on line 136 and a signal on line 166 to be described in more detail hereinafter. The output of phase detector 166 is filtered by differentiating filter 170 and summed in summer 172 with the signal representative of the period of the external clock source on line 136 from the frequency counter 164. The output of summer 172 is fed into an integrating filter 174 that functions as a low-pass filter. The output of integrating filter 174 is then sent to a circuit 176 that converts the period to a frequency by performing a 1/period function and providing any appropriate scaling. The signal from circuit 136 is then sent to sigma-delta modulator 94. The four-bit code from sigma-delta modulator 94 is used to control interpolator 138 or interpolators 30 or 92 in the same manner as described in connection with the embodiment of FIGS. 2 and 3, respectively.

The 4-bit code is also fed into a clock generation circuit 178 that effectively produces an output clock at 384 times greater than the signal on line 136. Circuit 178 performs this function by suppressing a certain number of 24.576 MHz clock cycles in response to the 4-bit code from sigma-delta modulator 94. The following examples will serve to illustrate. Assume sigma-delta modulator 94 is clocked by a 3.072 MHz clock. For every 3.072 MHz clock, there are eight 24.576 MHz clocks applied to circuit 178. In accordance with Table 2, circuit 178 suppresses a number of 24.576 MHz clocks as a function of the 4-bit code output by sigma-delta modulator 94. For example, if the external frequency source on line 136 is 32 kHz, then sigma-delta modulator 94 outputs, on average, a 0 code. The 0 code directs circuit 178 to allow four out of every eight 24.576 MHz clocks to pass through. Stated another way, circuit 178 suppresses four out of every eight 24.576 MHz clocks in response to a 0 code.

If the external clock frequency source is 4 kHz, then sigma-delta modulator 94 outputs, on average, an equal number of −3 and −4 codes. The −3 code directs circuit 178 to allow one out of every eight 24.576 MHz clocks to pass through (i.e, circuit 178 suppresses seven out of every eight 24.576 MHz clocks in response to a −3 code). The −4 code directs circuit 178 to allow no 24.576 MHz clocks to pass through (i.e., circuit 178 suppresses eight out of every eight 24.576 MHz clocks in response to a −4 code). On average, therefore, one out of every sixteen 24.576 MHz clocks will pass through suppressor circuit 178 in response to an average of −3 and −4 codes.

The remainder of phase locked loop 122 including randomizer/suppressor circuit 178, divider 184, and divider 188 operate in the same manner as discussed in connection with phase locked loop 120.

For the examples just discussed above, if the external clock on line 136 is 32 kHz, then the signal on line 182 is approximately 12.288 MHz. When decimated by ninety-six and then four, the signal on line 168 is 23 kHz. If the external clock on line 136 is 4 kHz, then the signal on line 182 is approximately 1.536 MHz. When decimated by ninety-six and then four, the signal on line 168 is 4 kHz.

Circuit 176, sigma-delta modulator 94, and clock randomizer/suppressor circuit 178 together form a digitally-controlled oscillator.

The embodiments of the present invention including phase locked loops allow the digital-to-digital converter to accept digital data at any data rate within the working range of the system, and lock to an externally supplied clock source that allows conversion of the incoming digital data to a data rate that is not necessarily the same as or even an integer or rational relationship with the master clock controlling the digital-to-digital converter.

The illustrated embodiments of the invention may be characterized as using a combination of fixed interpolation followed by variable decimation and then variable interpolation followed by fixed decimation. That is, with reference to FIG. 2, the digital data stream on line 12 is interpolated by a fixed ratio to increase the sample rate. This higher sample rate digital signal is then variably decimated under control of sigma-delta modulator 20 to provide the digital data stream on line 14 at another sample rate. Thereafter, the digital data stream on line 28 (which has the same data rate as the digital data stream on line 14) is variably interpolated under control of sigma-delta modulator 32 to variably increase the sample rate. This higher sample rate digital signal is then decimated by a fixed ratio to provide the digital data stream on line 42 at another sample rate. The sample rates of the digital data stream on lines 14 and 28 are at a common sample rate. In the illustrated embodiment, the common sample rate is 3.072 MHz.

Figure 8:
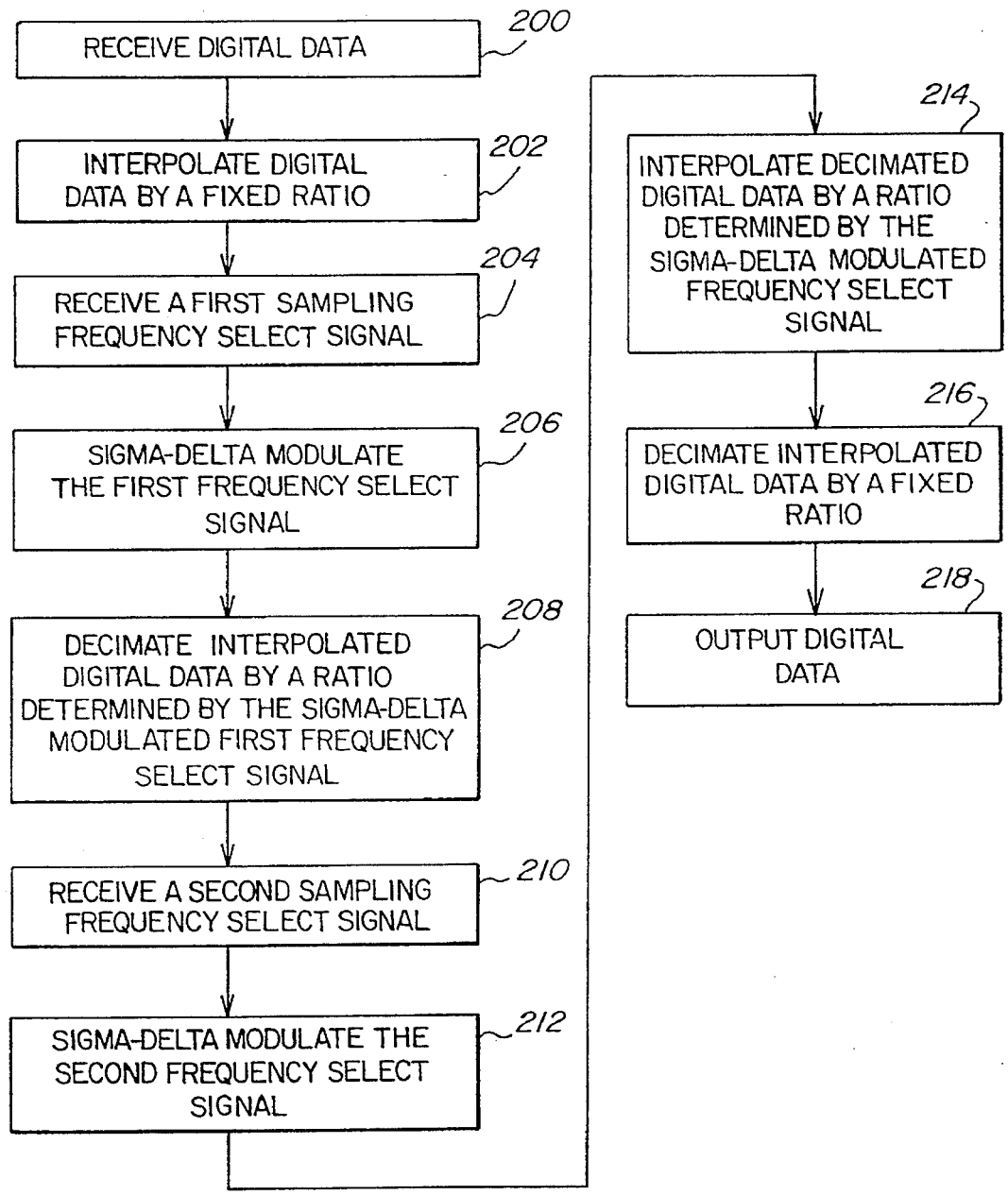
FIG. 8 is a flow chart illustrating the steps of the method of the present invention.

Reference is now made to FIG. 8 which is a flow chart illustrating the method of the present invention. FIG. 8 illustrates the method of fixed interpolation followed by variable decimation and then variable interpolation followed by fixed decimation.

In FIG. 8, the method begins in step 200 in which the input digital data having a first data rate is received. From step 200, the method proceeds to step 202 in which the input digital data is interpolated by a fixed ratio to increase the sample rate of the digital data to provide an oversampled digital data stream. From step 202, the method proceeds to step 204 in which a first sampling frequency select signal representative of the sample rate of the digital data received in step 200 is received. From step 204, the method proceeds to step 206 in which the first sampling frequency select signal is sigma-delta modulated. From step 206, the method proceeds to step 208 in which the interpolated digital data is decimated under control of the sigma-delta modulated frequency select signal by a ratio determined by the sigma-delta modulated first sampling frequency select signal. From step 208, the method proceeds to step 210 in which a second sampling frequency select signal representative of the desired output sample rate is received. From step 210, the method proceeds to step 212 in which the second sampling frequency select signal is sigma-delta modulated. From step 212, the method proceeds to step 214 in which the digital data is interpolated by a ratio determined by the sigma-delta modulated second sampling frequency select signal to increase the sample rate of the digital data. From step 214, the method proceeds to step 216 in which the interpolated digital data is decimated to provide the output digital data at the desired sample rate. From step 216, the method proceeds to step 218 in which the digital signal is output.

In summary, the present invention converts an incoming digital data stream to a common data rate by interpolating to create an oversampled signal and then variably decimating the oversampled signal to provide a digital data stream at the common data rate. The common data rate digital data stream is then variably interpolated to create an oversampled signal and then decimated by a fixed decimation ratio to provide a digital data stream at the output having a desired sample rate. The present invention can thus convert incoming digital data at any data rate within the working range of the system to an output digital data stream at any arbitrary data rate within the working range of the system. The present invention may also be use to convert an incoming digital signal to a digital signal having the common data rate. For example, with reference to FIG. 2, an incoming digital signal on line 12 can be converted to a digital signal having a common data rate on line 28. This common rate digital on line 28 can be output as an output signal to be used by other devices that require digital data at the common data rate. This aspect of the present invention is advantageous because it allows digital data streams having differing data rates to be converted to a digital data stream having a common data rate. In the same manner, the present invention can convert a digital data stream at the common data rate to a digital data stream at any data rate within the working range of the system. For example, with reference to FIG. 2, a digital data stream on line 28 can be converted to a digital data stream at any data rate and output on line 42. This aspect of the present invention is advantageous because it allows the digital data stream on line 28 at the common data rate to be converted to a digital data stream at any other data rate, thus allowing the invention to provide an interface between a common data rate and data rates that may be required by other digital systems.

The present invention advantageously converts an incoming digital data stream at any data rate within the working range of the system to an outgoing digital data stream at any data rate within the working range of the system. The data rates of the incoming digital data stream, the outgoing digital data stream, the common data rate, and the clock rate of the system clock do not need to be related by any integer or rational relationship.

Another significant advantage of the present invention is that the digital-to-digital converter does not have to be capable of interpolating the digital data up to the lowest common frequency between the incoming or outgoing digital data rate and the modulator clock frequency. This is due to the sigma-delta modulation of the sampling intervals. Unlike prior art digital-to-digital converters, the sampling interval does not have to correspond exactly to a fixed relationship between the incoming or outgoing digital data rate and the modulator clock. Since the incoming, outgoing, and common sample rates are sigma-delta encoded in the present invention, the sample rates, on average, will represent the desired sample rates with the noise or jitter on the sampling points being pushed into the higher frequency ranges. The present invention thus takes advantage of sigma-delta encoding of the time base to avoid the need for interpolation to very high frequencies, which in the prior art, typically were in the gigahertz range. An additional benefit of this process is that when the present invention is incorporated into an integrated circuit, a significant savings in chip area can be realized by the use of lower interpolation ratios.

Another important advantage of the present invention is that the sigma-delta modulators used to control decimation and interpolation can be clocked using a fixed clock frequency, allowing optimization of the modulator operation at the fixed clock frequency.

Finally, by appropriate combination of sigma-delta control codes in appropriate percentages, an infinite number of sample rates for the output digital data stream can be provided. These sample rates do not need to have any integer or rational relationship with the master clock used to run the digital-to-digital converter or the sample rate of the incoming digital data stream.

Although interpolation has been used herein to explain the method (and an interpolator as the apparatus) by which a digital data stream is converted into a higher sample rate digital data stream, the present invention is not so limited. Any method or apparatus that converts the digital data stream into a higher sample rate digital data stream may be used to practice the invention.

Interpolators and decimators useful in the present invention may be constructed as shown in Introduction to *Digital Signal Processing* by John Proakis and Dimitris Manolakis, published by Macmillan Publishing Company, © 1988.

There are many references describing sigma-delta systems. One example is entitled *Mixed-Signal Design Seminar* published by Analog Devices, Inc., 1991, which is incorporated herein by reference.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A digital-to-digital converter, comprising:

first interpolation means for receiving a digital signal at a first data rate and for supplying digital signals at a first increased data rate;

first decimation means, coupled to the interpolation means, for decimating the digital signals at the first increased data rate to provide digital signals at a second data rate;

first sigma-delta modulator means, coupled to and controlling the decimation means, for providing a first sigma-delta modulated output signal representative of the first data rate and for controlling the decimation means to provide the digital signals at the second data rate;

second interpolation means, coupled to the first decimation means, for receiving the digital signals at the second data rate and for supplying the digital signals at a second increased data rate;

second decimation means, coupled to the second interpolation means, for decimating the digital signals at the second increased data rate to provide digital signals at a third data rate; and second sigma-delta modulator means, coupled to and controlling the second interpolation means, for providing a second sigma-delta modulated output signal representative of the third data rate and for controlling the second interpolation means to provide the digital signals at the second increased data rate.

2. The digital-to-digital converter of claim 1, further comprising:

first phase locked loop means, coupled to the first sigma-delta modulator means, for receiving a signal representative of the first data rate, locking to the signal, and providing a first control signal to the first sigma-delta modulator means that controls the first sigma-delta modulator means to provide the first sigma-delta modulated output signal.

3. The digital-to-digital converter of claim 2, further comprising:

second phase locked loop means, coupled to the second sigma-delta modulator means, for receiving a signal representative of the third data rate, locking to the signal, and providing a control signal to the second sigma-delta modulator means that controls the second sigma-delta modulator means to provide the second sigma-delta modulated output signal.

4. The digital-to-digital converter of claim 1, further comprising:

phase locked loop means, coupled to the second sigma-delta modulator means, for receiving a signal representative of the third data rate, locking to the signal, and providing a second control signal to the second sigma-delta modulator means that controls the second sigma-delta modulator means to provide the second sigma-delta modulated output signal.

\* \* \* \* \*